(12) United States Patent
Sun (10) Patent No.: US 8,872,515 B2
(45) Date of Patent: Oct. 28, 2014

(54) SYSTEM AND METHOD FOR DIFFUSION-MODULATED RELAXATION MAGNETIC RESONANCE IMAGING

(75) Inventor: Zhe Phillip Sun, Waltham, MA (US)

(73) Assignee: The General Hospital Corporation, Boston, MA (US)

( * ) Notice: Subject to any disclaimer, the term of this patent is extended or adjusted under 35 U.S.C. 154(b) by 473 days.

(21) Appl. No.: 13/363,527

(22) Filed: Feb. 1, 2012

(65) Prior Publication Data

US 2012/0194189 A1 Aug. 2, 2012

Related U.S. Application Data

(60) Provisional application No. 61/438,468, filed on Feb. 1, 2011.

(51) Int. Cl.
*G01V 3/00* (2006.01)
*G01R 33/50* (2006.01)
*G01R 33/563* (2006.01)

(52) U.S. Cl.
CPC .......... *G01R 33/50* (2013.01); *G01R 33/56341* (2013.01)

USPC .......................................... 324/309; 324/307

(58) Field of Classification Search
USPC .......................... 324/309, 307, 306, 312, 314
See application file for complete search history.

(56) References Cited

U.S. PATENT DOCUMENTS

| | | | | |
|---|---|---|---|---|
| 6,163,152 | A * | 12/2000 | Bernstein et al. | 324/306 |
| 7,560,926 | B2 * | 7/2009 | Meredith et al. | 324/309 |
| 7,667,460 | B2 * | 2/2010 | Lamerichs et al. | 324/309 |
| 8,098,068 | B2 * | 1/2012 | Yanasak et al. | 324/309 |
| 2010/0254584 | A1 * | 10/2010 | Gulsun et al. | 382/131 |

* cited by examiner

*Primary Examiner* — Louis Arana
(74) *Attorney, Agent, or Firm* — Quarles & Brady, LLP (57) ABSTRACT

A system and method for applying an RF excitation pulse to the region of interest (ROI) and a plurality of selective gradients to the ROI to elicit MR data pertaining to at least a first MR parameter from the ROI. The system and method also apply at least one diffusion gradient to the ROI to modulate the first MR parameter with a second MR parameter, acquire MR data from the ROI, and reconstruct a parametric map of the ROI using the MR data, wherein the parametric map is weighted based on the first MR parameter and modulated by the second MR parameter.

14 Claims, 5 Drawing Sheets

SYSTEM AND METHOD FOR DIFFUSION-MODULATED RELAXATION MAGNETIC RESONANCE IMAGING

CROSS-REFERENCE TO RELATED APPLICATIONS

The present application is based on, claims the benefit of, and incorporates herein by reference U.S. Provisional Application Ser. No. 61/438,468, filed Feb. 1, 2011, and entitled, "SYSTEM AND METHOD FOR DIFFUSION-MODULATED RELAXATION MAGNETIC RESONANCE IMAGING."

STATEMENT REGARDING FEDERALLY SPONSORED RESEARCH

This invention was made with Government support under Grant No. EB009771 awarded by the National Institutes of Health. The Government has certain rights in this invention.

BACKGROUND OF THE INVENTION

The field of the invention is magnetic resonance imaging ("MRI") systems and methods. More particularly, the invention relates to systems and methods for deriving new clinically-useful information from a plurality of contrast mechanisms.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins," after the excitation signal $B_1$ is terminated, and this signal may be received and processed to form an image.

In MRI systems, the excited spins induce an oscillating sine wave signal in a receiving coil. The frequency of this signal is near the Larmor frequency, and its initial amplitude, $A_0$, is determined by the magnitude of the transverse magnetic moment $M_t$. The amplitude, A, of the emitted NMR signal decays in an exponential fashion with time, t. The decay constant $1/T^*2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field. The practical value of the $T_2$ constant is that tissues have different $T_2$ values and this can be exploited as a means of enhancing the contrast between such tissues.

Another important factor that contributes to the amplitude A of the NMR signal is referred to as the spin-lattice relaxation process that is characterized by the time constant $T_1$. It describes the recovery of the net magnetic moment M to its equilibrium value along the axis of magnetic polarization (z). The $T_1$ time constant is longer than $T_2$, much longer in most substances of medical interest. As with the $T_2$ constant, the difference in $T_1$ between tissues can be exploited to provide image contrast.

Thus, images weighted based on the $T_1$ or $T_2$ time constants can be referred to as relaxation weighted imaging; however, a variety of other contrast mechanisms have also been developed. For example, a so-called diffusion weighted imaging ("DWI") pulse sequence uses motion sensitizing magnetic field gradients to obtain images having contrast related to the diffusion of water or other fluid molecules. Specifically, a DWI pulse sequence applies diffusion sensitizing magnetic field gradients in selected directions during the MRI measurement cycle to obtain MR images that have an image contrast related to the diffusion of water or other fluid molecules that occurred during the application of the diffusion gradients. Using these DWI images, an apparent diffusion coefficient ("ADC") may be calculated for each voxel location in the reconstructed images.

Though the particular information sought in given clinical application may dictate a desired contrast mechanism (for example, $T_1$ weighting, $T_2$ weighting, diffusion weighting, perfusion imaging, and the like), it is well known that biological tissue is often heterogeneous and, therefore, has heterogeneous MR parameters, including $T_1$ relaxation times, $T_2$ relaxation times, diffusion coefficients, and magnetization transfer (MT), to name but a few. Accordingly, in many clinical settings, it would often be desirable to perform multiple MR acquisitions, each focusing on different contrast mechanisms, to ensure that the clinician is provided with a broad spectrum of information that, ideally, provides a full and accurate picture of the subject.

For instance, during acute stroke, the diffusion of ischemic lesion decreases significantly. While for chronic stroke and tumor tissue, diffusion often is elevated due to edema and change in vasculature. As such, it is often desirable to perform multiple MR studies to acquire diffusion-weighted images, as well as other measurements to probe heterogeneous tissue damage. However, in many clinical settings and, particularly, when time is of the essence to diagnose and intervene to minimize the potential impact of the underlying conditions, it may be impractical to perform a large number of extended imaging studies.

Furthermore, MRI is known to be susceptible to partial volume effects, due to limited spatial resolution. Such limitations may be particularly severe when considering complex pathophysiological changes during disease states. For instance, ischemic tissue has an elevated $T_2$ relaxation constant within hours after hypoperfusion. However, the diffusion rate of ischemic tissue has a complex pattern, whereby it initially decreases but then slowly recovers in about one week. Again, when looking to consider complex pathophysiological changes resulting during changes in disease states, it is desirable, yet not always cost effective to conduct a series of imaging studies spanning a variety of MR parameters.

Accordingly, it would be desirable to have a system and method that provides a clinician with the ability to acquire information about a variety of contrast mechanisms and MR parameters without requiring lengthy and/or repetitive imaging studies.

SUMMARY OF THE INVENTION

The present invention overcomes the aforementioned drawbacks by providing a system and method for acquiring information about multiple MR parameters, such as $T_1$ relaxation times or $T_2$ relaxation times and diffusion information, during a combined imaging acquisition. Specifically, the present invention provides an MR pulse sequence that sensitizes $T_2$ MRI acquisitions to diffusion parameters to generate diffusion modulated $T_2$-weighted MR images and, more particularly, to quantify $T_2$ using multiple $T_2$-weighted MR images having similar diffusion weighting. For example, by superimposing diffusion gradients upon spin echo $T_2$ MRI acquisitions, filtered parametric $T_2$ maps and other, multi-MR parameter weighted images can be generated.

In accordance with one aspect of the invention, a magnetic resonance imaging (MRI) system is disclosed that includes a magnet system configured to generate a polarizing magnetic field about at least a region of interest (ROI) of a subject arranged in the MRI system and a plurality of gradient coils configured to apply a gradient field with respect to the polarizing magnetic field. The system also includes a radio frequency (RF) system configured to apply RF excitation fields to the subject and a acquire MR image data therefrom and a computer programmed to control the plurality of gradient coils and the RF system. The computer is programmed to cause the system to apply an RF excitation pulse to the ROI and a plurality of selective gradients to the ROI to elicit MR data pertaining to at least a first MR parameter from the ROI. The computer is further programmed to cause the system to apply at least one diffusion gradient to the ROI to modulate the first MR parameter with a second MR parameter, acquire MR data from the ROI, and reconstruct a parametric map of the ROI using the MR data, wherein the parametric map is weighted based on the first MR parameter and modulated by the second MR parameter.

In accordance with another aspect of the present invention, a method for acquiring images of a region of interest (ROI) of a subject using a magnetic resonance imaging system is disclosed that includes applying an RF excitation pulse to the ROI in the presence of a first slice selective gradient. The method also includes applying at least one diffusion sensitizing gradient, applying a refocusing RF pulse to the ROI in the presence of a second slice selective gradient, and apply a readout gradient to acquire a echo signal from the ROI. The method then includes reconstructing a parametric map from the acquired echo signal that is weighted based on the a MR relaxation parameter and modulated by a diffusion parameter.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF THE INVENTION

Figure 1:
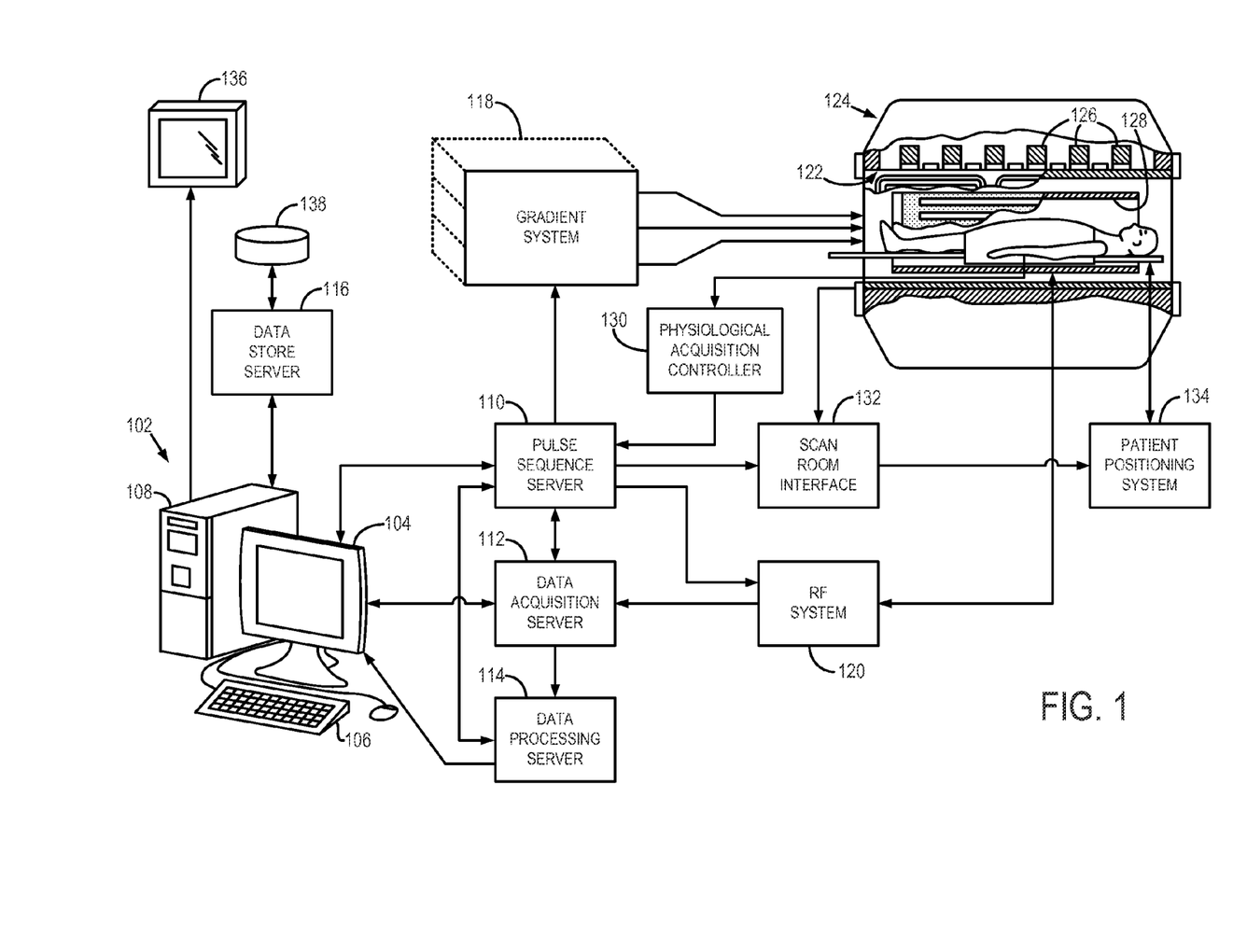
FIG. 1 is a block diagram of an MRI system that employs the present invention.

Referring to FIG. 1, an exemplary MRI system 100 for use with the present invention is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2}$$   Eqn. 1;

and the phase of the received MR signal may also be determined:

$$\varphi = \tan^{-1}\left(\frac{Q}{I}\right).$$   Eqn. 2

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography ("MRA") scan. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

As mentioned above, relaxation weighted and diffusion weighted MRI are commonly used imaging techniques that have become a vital clinical resource. For example, MRI imaging using such contrast mechanisms are commonly used for studying pathologies such as acute stroke and tumor, and hold great promise for non-invasive evaluation of prognosis and novel therapeutics. For instance, when considering ischemic tissue, it is known that the $T_2$ relaxation constant of ischemic tissues becomes elevated within hours after hypoperfusion, making $T_2$-weighted MRI a widely used imaging technique for quantifying stroke outcome. In fact, $T_2$ or fluid attenuated inversion recovery (FLAIR) $T_2$ MRI is often applied to image stroke lesions, which is vital for the non-invasive evaluation of treatment outcome and assessment of novel therapeutic agents. In addition, diffusion MRI is also very sensitive to acute stroke, and can detect ischemic lesions immediately after hypoperfusion. As a result, accurate measurement of tissue ADC and $T_2$ are important for properly characterizing stroke pathophysiology.

Although extremely versatile and useful, MRI, however, may be subject to non-negligible partial volume effects due to its limited spatial resolution and slice thickness. Moreover, cerebral tissue is heterogeneous; it contains white matter (WM), gray matter (GM), cerebral spinal fluid (CSF) and blood vessels whose diffusion and relaxations properties may be drastically different upon ischemia. For example, normal cerebral tissue ADC is approximately 0.8 $\mu m^2/ms$, while it decreases significantly to about 0.5 $\mu m^2/ms$ upon ischemia. In contrast, within hours of ischemia, ischemic tissue $T_2$ can elevate from its normal value of 60 ms to 100 ms and above, due to edema. Hence, if partial volume effect (in plane and slice thickness) is not properly accounted for, MRI measurement only reflects an ensemble average of normal and ischemic tissue properties, and may not be specific to stroke lesion. As a result, there may be severe mischaracterization of stroke prognosis, impeding automated image analysis and segmentation.

To address these clinical needs, the present invention provides systems and methods for using the above-described systems to acquire multi-MR parameter images using a combined pulse sequence. For example, in accordance with the present invention, diffusion weighting may be applied to modulate $T_2$ or $T_1$ imaging. More particularly, diffusion weighting may be applied to modulate the standard spin echo $T_2$ MRI.

Figure 2:
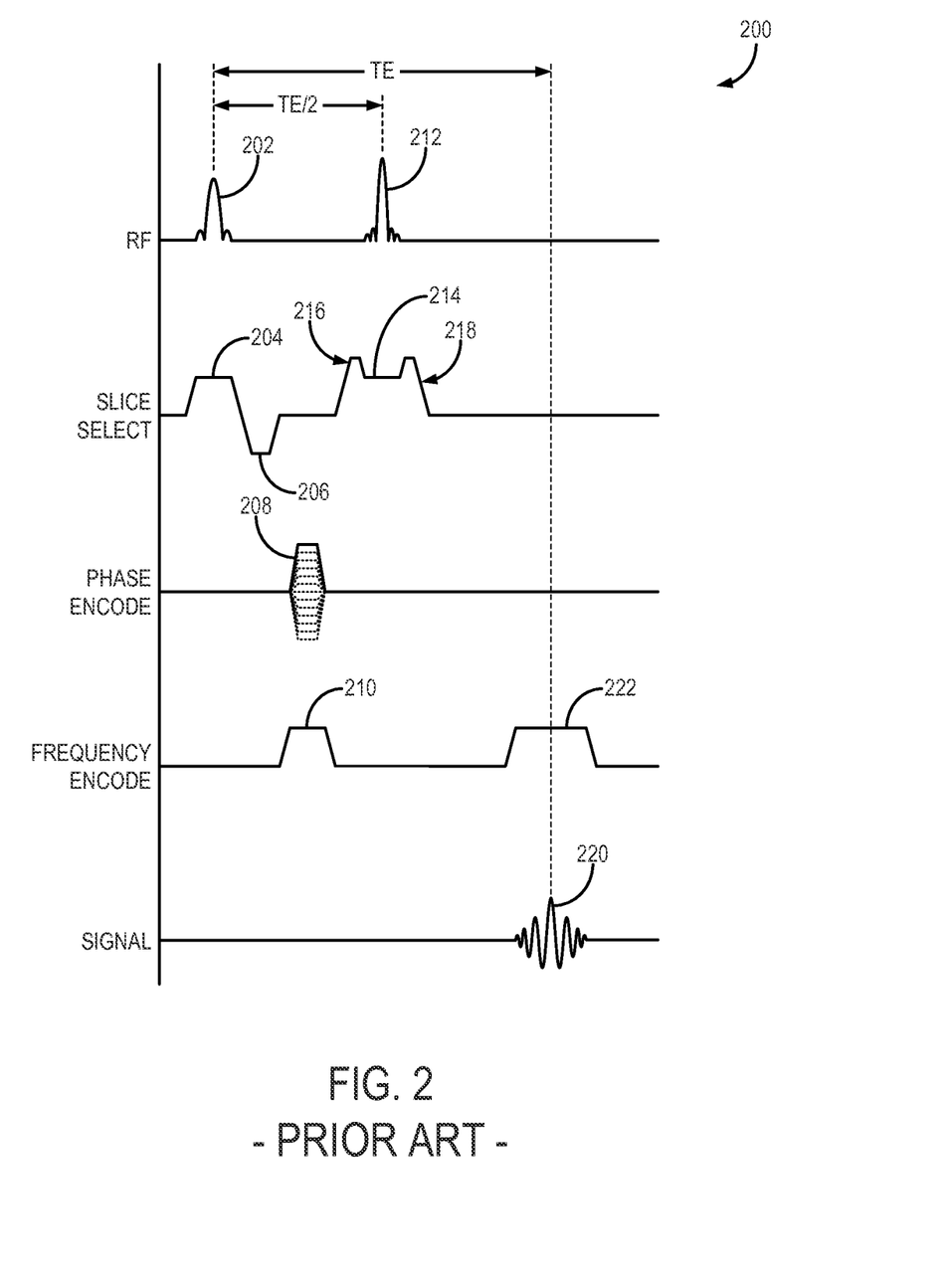
FIG. 2 is a diagram of spin-echo pulse sequence.

Referring to FIG. 2, a pulse sequence diagram 200 for a spin-echo pulse sequence is illustrated. As illustrated, the spin-echo pulse sequence 200 includes an RF excitation pulse 202 that is played out in the presence of a slice selective gradient 204. To mitigate signal losses resulting from phase dispersions produced by the slice selective gradient 204, a rephasing lobe 206 is applied after the slice selective gradient 204. Next, a refocusing RF pulse 212 is applied following a phase encoding gradient 208 and associated readout gradient 210. In order to substantially reduce unwanted phase dispersions, along with the refocusing pulse 212, a first crusher gradient 216 bridges the slice selective gradient 214 with a second crusher gradient 218. A spin-echo MR signal 220 is acquired during the application of a readout gradient 222. As is known in the art, the pulse sequence 200 may be repeated a plurality of times while stepping the phase encoding gradient 208 through a plurality of different values. This process may then be repeated with different slice selective gradients 204, 214 so as to acquire image data from different slice locations. Accordingly, the TR is defined as the time between RF excitation pulses 202 and the TE is the time between the RF excitation pulse 202 and the spin echo 220.

For the conventional $T_2$ MRI sequence described above, the MR signal at TE is given as:

$$M(TE) = M_{SS} \cdot e^{-TE/T_2} \cdot \sin \alpha \qquad \text{Eqn: 3;}$$

where $M_{SS}$ is the steady state magnetization, $T_2$ is the transverse relaxation time, and a is the excitation angle. The steady-state magnetization depends on several parameters including repetition time (TR), excitation angle a, longitudinal relaxation time ($T_1$), and spin density ($M_0$). For simplicity in discussion, it can be assumed that the TR is very long compared with the duration of the $T_1$ relaxation time, while the excitation angle is an ideal $\pi/2$ pulse. For cerebral tissue, it can be assumed that the fraction of normal and ischemic tissue is denoted by $f_n$ and $f_i$, respectively, and $f_n + f_i = 1$. Also, for cerebral tissue, the $T_2$ relaxation time and diffusion rates are given by $T_{2n,i}$ and $D_{n,i}$, respectively. With this background in place, MR signal from the conventional spin echo $T_2$ MRI sequence is given by:

$$M(TE) = M_i + M_n \qquad \text{Eqn. 4}$$
$$= M_0 \cdot (f_i \cdot e^{-TE/T_{2i}} + (1 - f_i) \cdot e^{-TE/T_{2n}}).$$

As such, the ratio of ischemic tissue signal to total MR signal, that is, $M_i/(M_i+M_n)$ can be shown to be:

$$\eta(TE) = \frac{f_i \cdot e^{-TE/T_{2i}}}{f_i \cdot e^{-TE/T_{2i}} + (1 - f_i) \cdot e^{-TE/T_{2n}}} \qquad \text{Eqn. 5}$$
$$= \frac{f_i}{f_i + (1 - f_i) \cdot [e^{-TE \cdot (1/T_{2n} - 1/T_{2i})}]}.$$

Thus, it can be seen that the relative contribution from ischemic tissue will be enhanced at longer echo time.

As can be seen, with conventional $T_2$-weighted MRI, calibration of parametric $T_2$, often with a simplistic assumption of mono-exponential decay, at best, can be achieved by varying echo time (TE). However, as will be described, the present invention provides a system and method for acquiring information about multiple MR parameters, such as $T_1$ relaxation times or $T_2$ relaxation times and diffusion information, during a combined imaging acquisition. Specifically, the present invention provides a system and method to generate multi-MR parameter weighted images. For example, in one particular application, the present invention provides an MR pulse sequence that sensitizes $T_2$ MRI acquisitions to diffusion parameters to generate parametric diffusion modulated $T_2$-weighted MR images.

Figure 3A:
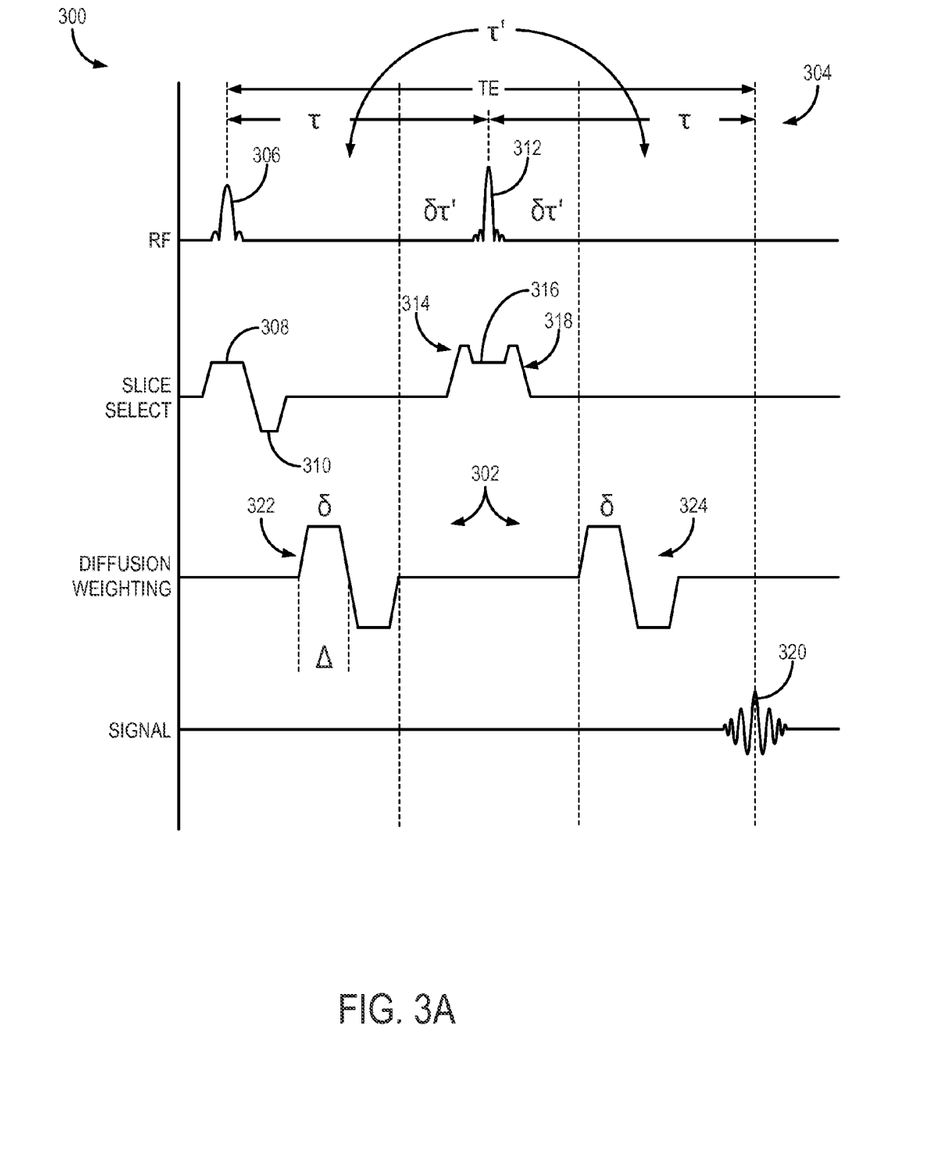
FIG. 3A is a diagram of a multi-MR parameter pulse sequence in accordance with the present invention.

Turning now to FIG. 3A, an example of a multi-MR parameter pulse sequence 300 for acquiring data for multi-MR parameter weighted images is provided. The, exemplary, illustrated multi-MR parameter pulse sequence 300 includes diffusion sensitizing gradients 302 that are superimposed upon a spin echo (SE) $T_2$ sequence 304. However, as will be described, it is contemplated that other multi-MR parameter pulse sequences, such as those that include diffusion sensitizing gradients 302 that are superimposed with other $T_2$ sequences or superimposed with $T_1$ sequences, may also be used in accordance with the present invention.

In particular, the illustrated multi-MR parameter pulse sequence 300, like a traditional SE pulse sequence, includes an RF excitation pulse 306 that is played out in the presence of a slice selective gradient 308. To mitigate signal losses resulting from phase dispersions produced by the slice selective gradient 308, a rephasing lobe 310 is applied after the slice selective gradient 308. A refocusing RF pulse 312 is applied and, in order to substantially reduce unwanted phase dispersions, a first crusher gradient 314 bridges the slice selective gradient 316 with a second crusher gradient 318. A spin-echo MR signal 320 is acquired during the application of a readout gradient. It is noted that an echo planner imaging (EPI) readout may be used for image readout, for example, so $T_2$ measures can be obtained with a single echo technique. As mentioned above, unlike traditional SE pulse sequences or traditional pulse sequences designed for diffusion-weighted imaging, the multi-MR parameter pulse sequence 300 includes diffusion sensitizing gradients 302 that are superimposed upon a SE $T_2$ sequence 304. To this end, a pair of bipolar gradients 322, 324 are inserted before and after the refocusing RF pulse 312. The inclusion of the pair of bipolar gradients 322, 324 defines two new quantities, T' and δT', that are subcomponents of T. As will be described in further detail, using the present invention, the TE can be adjusted by varying δT', while the magnitude and duration of diffusion gradients 302 are fixed because T=T'+δT'.

Figure 3B:
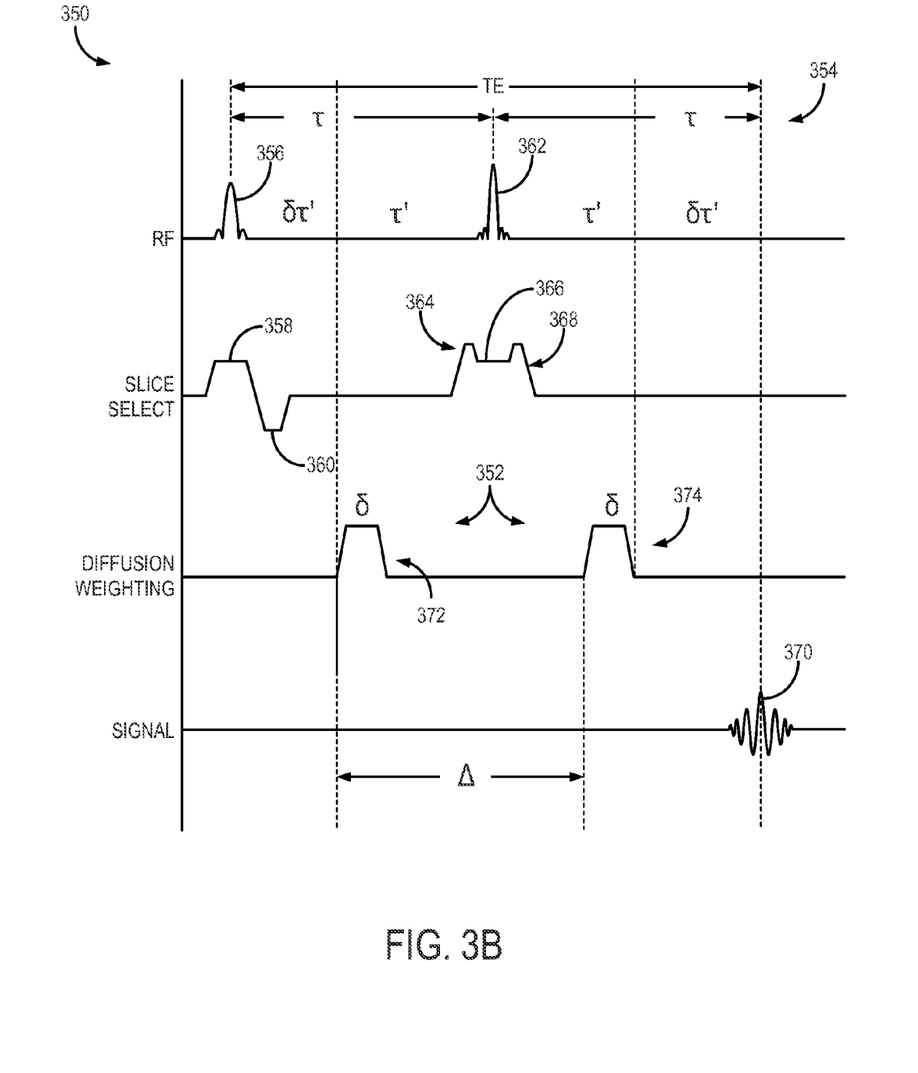
FIG. 3B is a diagram of another multi-MR parameter pulse sequence in accordance with the present invention.

However, as illustrated in FIG. 3B, it is contemplated that the diffusion modulated $T_2$ MRI sequence of FIG. 3A, in which the variable delays are positioned before and after the pair of diffusion sensitizing gradients 322, 324, may be modified. Specifically, as illustrated in FIG. 3B, another configuration of a multi-MR parameter pulse sequence 350 is provided whereby variations of the TE do not affect the diffusion b-factor, thereby, allowing calibration of absolute $T_2$.

The, exemplary, illustrated multi-MR parameter pulse sequence 350 again includes diffusion sensitizing gradients 352 that are superimposed upon a spin echo (SE) $T_2$ sequence 354. However, unlike the multi-MR parameter pulse sequence 300 of FIG. 3A, in the multi-MR parameter pulse sequence 350 illustrated in FIG. 3B, the variable delays, δT', are positioned before and after the diffusion sensitizing gradients 352.

Again, like a traditional SE pulse sequence, the multi-MR parameter pulse sequence 350 includes an RF excitation pulse 306 that is played out in the presence of a slice selective gradient 358. To mitigate signal losses resulting from phase dispersions produced by the slice selective gradient 358, a rephasing lobe 360 is applied after the slice selective gradient 358. A refocusing RF pulse 362 is applied and, in order to substantially reduce unwanted phase dispersions, a first crusher gradient 364 bridges the slice selective gradient 366 with a second crusher gradient 368. A spin-echo MR signal 370 is acquired during the application of a readout gradient.

As noted previously, however, unlike traditional SE pulse sequences or traditional pulse sequences designed for diffusion-weighted imaging, the multi-MR parameter pulse sequence 350 includes diffusion sensitizing gradients 352 that are superimposed upon a SE $T_2$ sequence 354. To this end, diffusion gradients 372, 374 are inserted before and after the refocusing RF pulse 362. In this configuration, the TE can be adjusted by varying δT', while the magnitude and duration of diffusion gradients 372 are fixed because T=T'+δT'. However, variations of TE do not affect diffusion b-factor, allowing calibration of absolute $T_2$. Based on conventional spin echo DWI, additional adjustment of delays can be put before and after diffusion gradients to vary the echo time. As such, a pre-determined diffusion b-value can be obtained for a serial echo time, allowing diffusion modulated $T_2$ MRI.

Given that diffusion in, for example, cerebral tissue is anisotropic, isotropic diffusion weighting may be preferred to mitigate such effects. By simultaneously applying gradients along multiple directions, it is also efficient to reach a given moderate diffusion b-factor. This can be achieved by averaging multiple images with diffusion gradients applied along orthogonal directions, or several single-shot isotropic diffusion imaging techniques can be easily implemented. While on the other hand, such isotropic diffusion weighting is not necessary when parametric $T_2$ is calibrated. In addition, because the TE is prolonged due to diffusion gradients, the minimal echo time for the proposed multi-MR parameter pulse sequence 300, 350 may be slightly longer than that of the conventional SE $T_2$ sequence. However, for a representative diffusion b-factor of 500 $mm^2/s$, the diffusion module duration is less than 15 ms with a gradient strength of 30 g/cm in a single shot trace diffusion MRI sequence.

The above-described systems and methods can be applied to a variety of clinical settings to image a variety of MR parameters. For example, though the multi-MR parameter pulse sequences described above involve the superimposition of diffusion gradients over $T_2$-weighted pulse sequences, the present invention may likewise be applied to, for example, superimposition of diffusion gradients over $T_1$ weighted pulse sequences. In particular, a clinician may chose to create a diffusion modulated $T_1$ relaxation image or a diffusion modulated $T_1$ relaxation image, or another multi-MR parameter weighted image, based on the clinical needs and indications. The present invention allows the clinician to create diffusion-modulated relaxation parametric MR images, for example, to quantify $T_2$ using multiple $T_2$-weighted MR images having similar diffusion weighting and, thus, are substantially more sensitive than conventional $T_2$-weighted MR images. For example, diffusion modulated $T_2$ parametric images would be advantageous in renal applications and neurological applications, such as stroke. Also, in the case of stroke, data suggests an early $T_1$ change that could likewise be reflected in diffusion modulated $T_1$ relaxation images.

Exemplary Clinical Application: Stroke

In the example of diffusion modulated $T_2$ imaging, the difference in diffusion and relaxation rates between ischemic and normal cerebral tissue may be more readily discerned. The rationale is that in comparison with ischemic lesion, normal cerebral tissue has higher diffusivity, hence, diffusion weighting preferentially attenuates normal tissue signal with respect to that from ischemic lesion. As such, MR measurements will be weighted toward ischemic tissue due to reduced diffusion. In addition, application of diffusion gradients will prolong the echo time, which will concomitantly suppress normal tissue MR signal. In fact, it has been noted that diffusion and $T_2$ relaxation contrasts may be closely coupled in stroke imaging. Particularly, it is known that hyperintensity in diffusion-weighted MRI (DWI) may be attributed not only to decreased diffusivity of ischemic tissue, but also to its elevated $T_2$, and dubbed $T_2$ shine-through effect. In fact, calibration of quantitative ischemic tissue ADC is recommended to minimize the $T_2$ shine-through effects. Hence, there has been a long standing clinical need to expedite the acquisition of and increase the availability of both $T_2$ and diffusion information in the case of stroke, to name but one of many clinical applications.

Hence, the present invention can utilize the reduction of diffusivity in ischemic tissue to relatively suppress MR signal contribution from normal tissue, and make the "ensemble MR" (diffusion modulated $T_2$) measurement more specific to ischemic lesion. In consistent with the notion of $T_2$ shine-through effect, the multi-MR parameter pulse sequence, such as the diffusion modulated $T_2$ MRI sequence, of the present invention can be used to enhance ischemic lesion based on its decreased diffusivity, which may be regarded as an inverse diffusion shine-through contrast. Similar as conventional parametric $T_2$ imaging, the proposed diffusion modulated $T_2$ MRI also requires pseudo-linear fitting of images obtained at multiple echo times in order to derive the parametric $T_2$. It is important to point out that because identical diffusion weighting is applied for spin echo images, the obtained $T_2$ map is the average of $T_2$ value from two magnetization pools modulated by their diffusion property. As such, contribution from each component can be adjusted simply by varying the magnitude of diffusion b value.

As illustrated above, when using the conventional spin echo $T_2$ MRI sequence to perform clinical studies of stroke, the relative contribution from ischemic tissue will be enhanced at longer echo time. On the other hand, when performing multi-MR parameter imaging in accordance with the present invention, such as using a diffusion-modulated $T_2$ MRI sequence, the MR signal acquired is given by:

$$M(TE) = M_0 \cdot (f_i \cdot e^{-b \cdot D_i} \cdot e^{-TE/T_{2i}} + (1-f_i) \cdot e^{-b \cdot D_n} \cdot e^{-TE/T_{2n}}) \quad \text{Eqn. 6;}$$

where b is diffusion b value. The ratio of relative MR signal can be shown to be:

$$\eta'(b, TE) = \frac{f_i \cdot e^{-b \cdot D_i} \cdot e^{-TE/T_{2i}}}{f_i \cdot e^{-b \cdot D_i} \cdot e^{-TE/T_{2i}} + (1-f_i) \cdot e^{-b \cdot D_n} \cdot e^{-TE/T_{2n}}} \quad \text{Eqn. 7}$$

$$= \frac{f_i}{f_i + (1-f_i) \cdot e^{-b \cdot (D_n - D_i)} \cdot [e^{-TE \cdot (1/T_{2n} - 1/T_{2i})}]}.$$

In comparison with conventional $T_2$ MRI sequence, the contribution from normal tissue is attenuated due to diffusion modulation. It is important to note $\eta' = \eta$ when $b=0$, as expected.

To evaluate the performance of the diffusion modulated $T_2$ MRI technique of the present invention in the clinical application of stroke, the effect of diffusion and echo time on MR relaxation measurement may be evaluated using a simplistic 2-compartment tissue model (i.e., normal vs. ischemic tissue). In vivo results showed that ischemic tissue $T_2$ measured using the present invention is significantly higher than conventional spin echo $T_2$ measurement. In addition, the present invention can capture ischemic lesions not easily observable using the conventional $T_2$ MRI, strongly suggesting that the enhanced specificity to ischemic tissue may permit improved diagnosis.

Figure 4A:
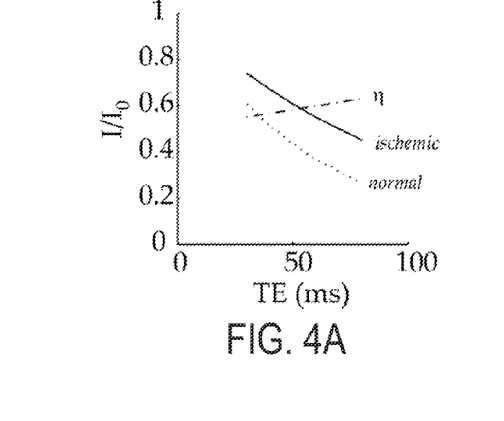
FIGS. 4A-4D are graphs for comparing the clinical data acquired using the multi-MR parameter pulse sequences of the present invention with data acquired using traditional imaging techniques.
Figure 4B:
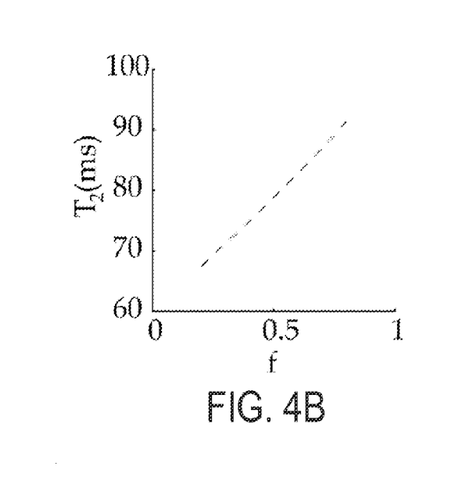
Figure 4C:
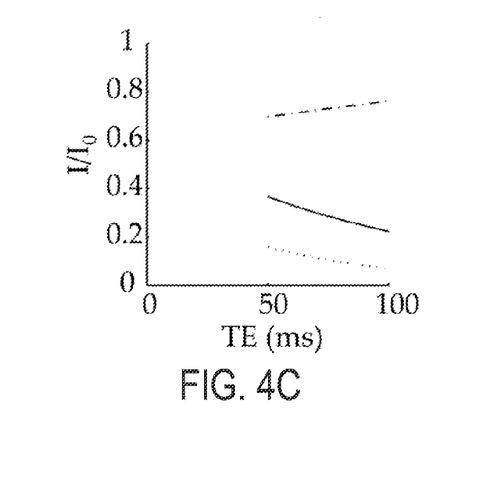
Figure 4D:
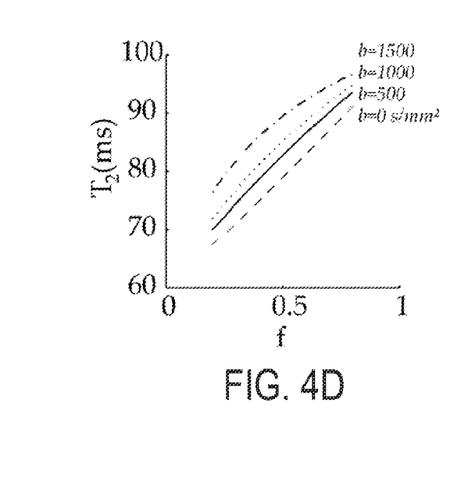

More particularly, numerical simulation can be applied to elucidate MR signal for both the conventional $T_2$ and the diffusion modulated $T_2$ MRI sequences of the present invention. Representative $T_2$ value of 60 and 100 ms, and diffusion coefficient of 0.8 and 0.5 $\mu m^2/ms$ were used for normal and ischemic tissue, respectively. Referring to FIG. 4A, normalized MR signal from ischemic (solid) and normal tissue (dotted) with TE from 30 to 80 ms is illustrated. For illustration, assuming that 50 percent of cerebral tissue is ischemic, the contribution from ischemic tissue signal to the total MR signal ($\eta$) is a function of echo time. It increases with echo time, consistent with the fact that ischemic tissue $T_2$ is elevated from that of normal tissue. Fitting the MRI signal against echo time with a commonly used single exponential decay function, the experimentally measured $T_2$ depends on ratio of ischemic tissue (f), as shown in FIG. 4B. The measured $T_2$ is an ensemble average of ischemic and normal tissue $T_2$, weighted by their fraction concentration. In contrast, diffusion modulated $T_2$ MRI data acquired in accordance with the present invention has additional contrast based on tissue diffusivity. For simulation, the echo time is increased by 20 ms to take into account of diffusion gradients. FIG. 4C shows that the ischemic tissue MR signal contribution ($\eta'$) is significantly enhanced from that without diffusion weighting (FIG. 4C vs. FIG. 4A), even at a moderate b value of 500 s/mm$^2$. In addition, the experimentally derived relaxation time varies not only with ischemic tissue fraction, but also depends on the applied diffusion b-value as it modulates the relative signal contribution from ischemic and normal tissues. FIG. 4D shows that $T_2$ obtained from diffusion modulated MR sequence is higher than that obtained with conventional MR sequence (dashed line). In addition, the difference between $T_2$ measurements increases at large b value.

$T_2$ maps obtained with the diffusion modulated spin echo MRI pulse sequence of the present invention clearly detected ischemic infarction in consecutive slices. In addition, the obtained $T_2$ value is significantly higher than that obtained with conventional spin echo MRI, suggesting that measurement from the diffusion modulated $T_2$ MRI is more specific to ischemic tissue. Using this phenomenon, automated and threshold-based lesion detection algorithms may be readily applied using the present invention with accuracy previously unachieved.

Therefore, the present invention illustrates that parametric $T_2$ maps obtained from diffusion modulated $T_2$ MRI sequences allow detection of ischemic lesions not easily observable using conventional spin echo $T_2$ MRI. In addition, MR identified ischemic lesion can be confirmed by histology. With this in mind, the present invention may be used to allow early and accurate assessment of ischemic lesion. In fact, it has been shown that MCAO ischemic tissue damage is still evolving beyond 24 hours, and it would be desirable to develop a $T_2$ mapping technique that is more specific to ischemic tissue, allowing sensitive and early calibration of infarction. While $T_2$ MRI has been commonly used to assess stroke lesion for permanent and complete MCAO, ischemic tissue outcome may be very heterogeneous for transient stroke.

Reperfusion, DWI, $T_2$ Lesion, and Biological Significance

As described above, the improved detection of reperfusion using the present invention is attributed to the fact that diffusion weighting causes additional modulation of normal tissue MR signal, hence, making final MR measurements more specific to ischemic tissue. It is also important to point out that the diffusion-modulated $T_2$ MRI suppresses not only normal cerebral tissue, but also other cerebral components of high diffusivity/pseudo-diffusivity, such as cerebral spinal fluid (CSF) and vascular blood signal. To this end, it may be, in certain clinical settings, desirable to use single shot isotropic diffusion sensitizing gradients to minimize artifacts due to anisotropic diffusion in cerebral tissue. However, it is worthwhile to note many other gradient forms can also be utilized, such as that proposed by Song et al. In addition, given that a parametric $T_2$ map is obtained, isotropic diffusion weighting is not required in many situations, as long as adequate diffusion weighting is obtained.

While the pulse sequences of the present invention provide enhanced detectability of ischemic lesion, it can be argued that similar detectability may be obtained using the conventional $T_2$ MRI, provided much finer spatial resolution. Although this may be the case, it remains advantageous to utilize the pulse sequences of the present invention when scan time, signal to noise ratio (SNR) and hardware limitations are considered. In addition, although the diffusion modulated $T_2$ MRI of the present invention is a hybrid sequence of diffusion weighted MRI and spin echo $T_2$ MRI, its contrast is unlikely simple replication of conventional $T_2$ and diffusion lesion. It is so because it combines diffusion weighting and spin echo $T_2$ MRI of serial echo time, and the obtained parametric $T_2$ map correlates diffusion and relaxation properties of ischemic tissue. As such, diffusion modulated $T_2$ MRI provides complementary information to both spin echo $T_2$ MRI and diffusion MRI.

Further still, it is contemplated that diffusion-modulated $T_2$ MRI in accordance with the present invention may be extended to $T_2^*$ measurement. Diffusion weighting may attenuate MR signal from normal tissue during acute stroke and, hence, makes both parametric $T_2$ and $T_2^*$ more specific toward ischemic tissue. As such, it may allow more accurate estimation of tissue oxygen extraction ratio (OER), which is particularly important for elucidating the oxygen metabolic status of perfusion/diffusion lesion mismatch. In fact, surrogate imaging markers of ischemic physiological status such as tissue pH and oxygen metabolism may provide vial and complementary information to commonly used perfusion and diffusion MRI, and ultimately, may facilitate development and evaluation of novel therapeutic agents and treatments.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
    a magnet system configured to generate a polarizing magnetic field about at least a region of interest (ROI) of a subject arranged in the MRI system;
    a plurality of gradient coils configured to apply a gradient field with respect to the polarizing magnetic field;
    a radio frequency (RF) system configured to apply RF excitation fields to the subject and a acquire MR image data therefrom; and
    a computer programmed to control the plurality of gradient coils and the RF system to perform the following steps:
        a) apply an RF excitation pulse to the ROI and a plurality of selective gradients to the ROI to elicit MR data pertaining to at least a first MR parameter from the ROI;
        b) apply at least one diffusion gradient to the ROI to modulate the first MR parameter with a second MR parameter;
        c) acquire MR data from the ROI; and
        d) reconstruct a parametric map of the ROI using the MR data, wherein the parametric map is weighted based on the first MR parameter and modulated by the second MR parameter.

2. The system of claim 1 wherein the first MR parameter includes at least one of a $T_1$ relaxation time and a $T_2$ relaxation time.

3. The system of claim 1 wherein the second MR parameter includes diffusion.

4. The system of claim 1 wherein step a) includes performing a spin echo pulse sequence.

5. The system of claim 4 wherein the spin echo pulse sequence is a $T_2$-weighted pulse sequence.

6. The system of claim 1 wherein step a) includes applying a refocusing RF pulse and step b) includes applying a pair of diffusion sensitizing gradients before and after the refocusing RF pulse.

7. The system of claim 6 wherein the computer is further programmed to employ a variable delay, $\delta T'$, and apply the variable delay before and after the diffusion sensitizing gradients.

8. The system of claim 7 wherein the computer is further programmed to employ an echo time (TE) considering the variable delay and wherein variations of TE do not affect a diffusion b-factor.

9. The system of claim 6 wherein the pair of diffusion sensitizing gradients includes bipolar diffusion sensitizing gradients.

10. A method for acquiring images of a region of interest (ROI) of a subject using a magnetic resonance imaging system, the method comprising the steps of:
    a) applying an RF excitation pulse to the ROI in the presence of a first slice selective gradient;
    b) applying at least one diffusion sensitizing gradient;
    c) applying a refocusing RF pulse to the ROI in the presence of a second slice selective gradient;
    d) apply a readout gradient to acquire an echo signal from the ROI;
    e) reconstructing a parametric map from the acquired echo signal that is weighted based on an MR relaxation parameter and modulated by a diffusion parameter.

11. The method of claim 10 wherein the MR relaxation parameter includes at least one of a $T_1$ relaxation time and a $T_2$ relaxation time.

12. The method of claim 10 wherein step b) includes applying a pair of diffusion sensitizing gradients before and after the refocusing RF pulse.

13. The method of claim 12 further comprising selecting a variable delay, $\delta T'$, and applying the variable delay before and after the at least one diffusion sensitizing gradient.

14. The method of claim 10 wherein the pair of diffusion sensitizing gradients includes bipolar diffusion sensitizing gradients.

* * * * *